US006573880B1

(12) United States Patent
Simoni et al.

(10) Patent No.: US 6,573,880 B1
(45) Date of Patent: Jun. 3, 2003

(54) APPLICATIONS FOR ELECTRONIC REUSABLE PAPER

(75) Inventors: Helen Davis Simoni, Cupertino, CA (US); Bryan T. Preas, Palo Alto, CA (US)

(73) Assignee: Xerox Corporation, Stamford, CT (US)

(*) Notice: Subject to any disclaimer, the term of this patent is extended or adjusted under 35 U.S.C. 154(b) by 0 days.

(21) Appl. No.: 09/440,675

(22) Filed: Nov. 16, 1999

(51) Int. Cl.[7] ................................................ H01L 27/12

(52) U.S. Cl. ......................... 345/87; 345/107; 313/498; 315/169.3; 340/571; 340/781; 340/815.4; 381/24; 395/480

(58) Field of Search ...................... 315/169.3; 313/498; 345/87, 107; 340/571, 781, 815.4; 395/480; 381/24; 455/566; 701/1

(56) References Cited

U.S. PATENT DOCUMENTS 3,735,513 A 5/1973 Constant, Jr. et al. .......... 40/32
3,753,581 A 8/1973 Kamstra ...................... 283/56
4,109,245 A 8/1978 Hedin ........................ 340/334
4,246,713 A 1/1981 Eckert ......................... 40/437
4,294,404 A * 10/1981 Gajjar ....................... 236/49.3
4,707,938 A 11/1987 Carssow ...................... 40/471
4,907,826 A 3/1990 Versage ....................... 283/56
4,944,087 A * 7/1990 Landi .......................... 29/848
4,982,183 A * 1/1991 Flegal et al. ................ 340/781
5,063,698 A 11/1991 Johnson et al. ............ 40/124.1
5,160,920 A 11/1992 Harris ........................ 340/765
5,171,038 A 12/1992 Bowler ...................... 281/15.1
5,217,286 A 6/1993 Ming-ho ...................... 362/31
5,282,917 A 2/1994 Danelski ..................... 156/277
5,293,706 A 3/1994 Wood ........................ 40/124.1
5,342,057 A 8/1994 Sorkoram ................... 273/239
5,467,459 A * 11/1995 Alexander et al. .......... 711/153
5,483,254 A * 1/1996 Powell ........................ 345/87
5,684,365 A * 11/1997 Tang et al. ............. 315/169.3
5,742,690 A * 4/1998 Edgar ......................... 381/300
5,821,688 A * 10/1998 Shanks et al. .............. 313/498
5,930,026 A 7/1999 Jacobson et al. ........... 359/296
6,098,085 A * 8/2000 Blonder et al. ............. 707/531
6,184,789 B1 * 2/2001 Richley et al. ............. 340/571
6,251,329 B1 * 6/2001 Sheridon .................... 264/427
6,262,706 B1 * 7/2001 Albert et al. ............... 345/107
6,265,984 B1 * 7/2001 Molinaroli ............... 340/815.4
6,278,887 B1 * 8/2001 Son et al. .................. 455/566
6,282,464 B1 * 8/2001 Obradovich ................... 701/1

FOREIGN PATENT DOCUMENTS

EP 0 933 752 A2 8/1999
WO WO 97/04398 2/1997

* cited by examiner

*Primary Examiner*—Bipin Shalwala
*Assistant Examiner*—Vincent E. Kovalick
(74) *Attorney, Agent, or Firm*—Nola Mae McBain

(57) ABSTRACT

A system for displaying information which comprises a substrate and a conformable display media and control logic associated with the substrate. The display media has an input for receiving display information and the control logic provides display information to the display media through the display media input. The system may also contain other elements which interact with the control logic and the display media such as sensors, speakers, buttons, lights and a interface for communicating with the control circuitry.

58 Claims, 5 Drawing Sheets

APPLICATIONS FOR ELECTRONIC REUSABLE PAPER

INCORPORATION BY REFERENCE

The following U.S. patents are fully incorporated by reference:

- U.S. Pat. No. 4,126,854 by Sheridon titled "Twisting Ball Panel Display" and issued Nov. 21, 1978,
- U.S. Pat. No. 5,604,027 by Sheridon titled "Some Uses Of Microencapsulation For Electric Paper" and issued Feb. 18, 1997,
- U.S. Pat. No. 5,717,514 by Sheridon titled "Polychromal Segmented Balls For A Twisting Ball Display" and issued Feb. 10, 1998,
- U.S. Pat. No. 5,808,783 by Sheridon titled "High Reflectance Gyricon Display" and issued Sep. 15, 1998,
- U.S. Pat. No. 5,815,306 by Sheridon et al., titled "'Egg-crate' Substrate for a Twisting Ball Display" and issued Sep. 29, 1998,
- U.S. Pat. No. 5,825,529 by Crowley titled "Gyricon Display With No Elastomer Substrate" and issued Oct. 20, 1998,
- U.S. patent application Ser. No. 08/960,865 by Sheridon et al., titled "Twisting Cylinder Display" and filed Oct. 30, 1997,
- U.S. patent application Ser. No. 09/306,752 by Preas et al., titled "Method And Apparatus For A Display Producing A Fixed Set Of Images" and filed May 7, 1999,
- U.S. patent application Ser. No. 09/153,327, by Richley et al., titled "Ambient Energy Powered Display" and filed on Sep. 15, 1998, and
- U.S. patent application Ser. No. 09/173,906, by Silverman titled "Additive Color Electric Paper Without Registration Or Alignment Of Individual Elements" and filed Oct. 16, 1998.

BACKGROUND

This invention relates generally to a variety of printed media, and more specifically provides a means for incorporating dynamic or sequenced images therein along side static information or images.

Products such as brochures, greeting cards, folders, advertising displays, and promotional gifts abound. Quite often, although not always, these products are paper based products that carry a message that has been printed on one or more surfaces of the product. While these products are convenient and inexpensive to make they may be only nominally effective at best. Their effectiveness depends directly on how effectively they engage and hold the attention of the recipient and convey their information. Many different techniques have been employed to hold the recipient's attention. For instance, blinking lights, pop-ups holograms, and edge illuminated diagrams have all been used to create an eye-catching image or set of images to hold the attention of the recipient. Cut-outs, overlays, flaps and ingenious folding techniques have been used to sequence information or reveal information in a controlled fashion. Engaging senses other than sight has been used to attract the viewer by employing sounds or scents. Sounds are often activated as a brochure or card is opened while scents can be revealed either by scratching a designated portion or removing a tab. In addition to any of these techniques, personalization of the material is often employed to target either a specific individual or class of individuals.

These techniques have met with varying success. One problem is that only a limited amount of information can be printed in a given amount of space. This restricts not only the amount of information that can be presented but its complexity as well because complex information generally needs need more text and diagrams to be explained clearly. Informational media, for instance, tends to be longer and may be offputting to the consumer by its length and complexity. However, simplification of the information may not communicate the specific information desired.

Another problem is that personalization must be determined prior to manufacture of the printed media. If the target audience is misjudged some quantity of printed media may turn out to be useless.

It would be advantageous therefore to provide printed media with the capability to sequence through multiple images or sets of information in a single limited space. Sequences of images can be designed to be eye-catching and to lead the viewer through complex concepts or information. It would further be useful if such information could be customized after manufacture and just immediately prior to distribution when the recipient is known. It would further be advantageous if the recipient of the information could control or select which information is displayed.

Further advantages of the invention will become apparent as the following description proceeds.

SUMMARY OF THE INVENTION

Briefly stated and in accordance with the present invention, there is provided a system for displaying information which comprises a substrate and a conformable display media and control logic associated with the substrate. The display media has an input for receiving display information and the control logic provides display information to the display media through the display media input. The system may also contain other elements which interact with the control logic and the display media such as sensors, speakers, buttons, lights and a interface for communicating with the control circuitry.

While the present invention will be described in connection with a preferred embodiment and/or method of use, it will be understood that it is not intended to limit the invention to that embodiment and procedure. On the contrary, it is intended to cover all alternatives, modifications and equivalents as may be included within the spirit and scope of the invention as defined by the appended claims.

DETAILED DESCRIPTION OF THE INVENTION

Figure 1:
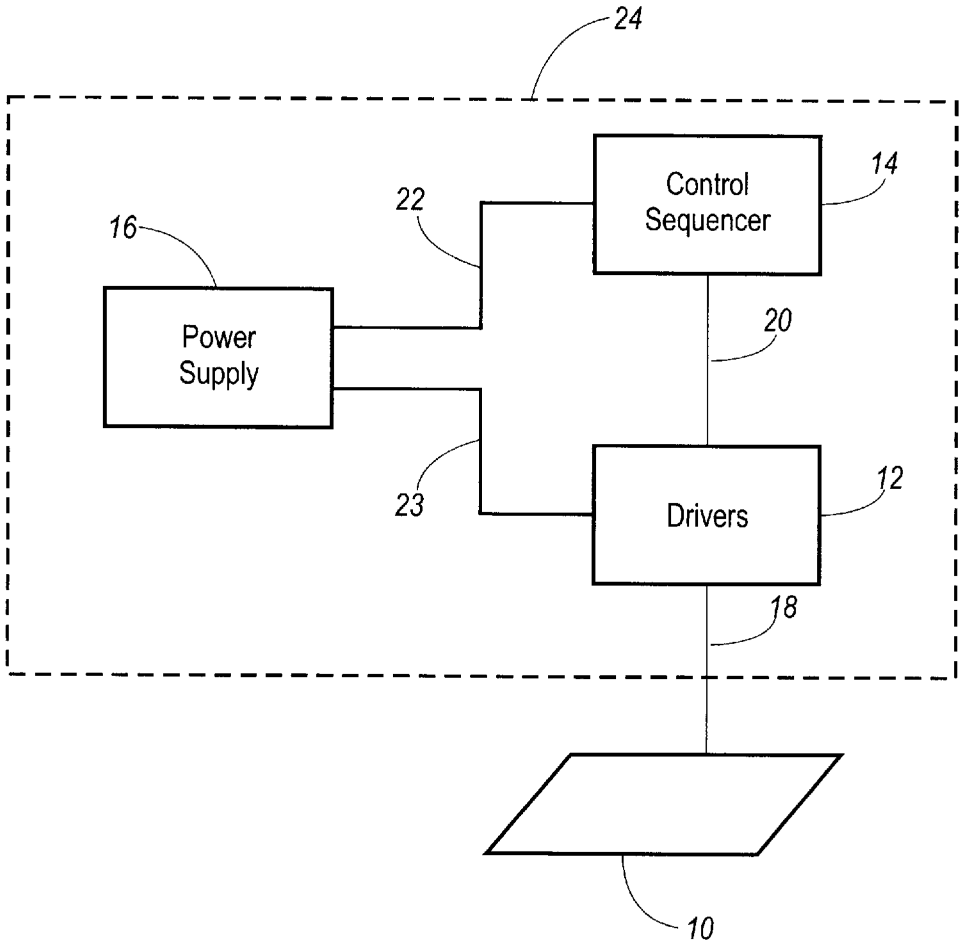
FIG. 1 is a system block diagram.

Turning now to FIG. 1, a block diagram for a basic system is shown. The core component to the system is conformable, lightweight, low-power sheet-like display media 10. Two types of such display media are currently known. One is the Immedia technology made by E-Ink Corporation of Cambridge, Mass. Immedia uses an "electronic ink" based on electrophoretic technology, which consists of an oil suspension of many tiny plastic particles. When an electric field is placed across the "electronic ink", the "electronic ink" changes color. The image persists even when the power is off.

The second is gyricon technology. Various types of gyricon display medium, their operational characteristics, and manufacture are described in U.S. Pat. No. 4,126,854 by Sheridon titled "Twisting Ball Panel Display" and issued Nov. 21, 1978, U.S. Pat. No. 5,604,027 by Sheridon titled "Some Uses Of Microencapsulation For Electric Paper" and issued Feb. 18, 1997, U.S. Pat. No. 5,717,514 by Sheridon titled "Polychromal Segmented Balls For A Twisting Ball Display" and issued Feb. 10, 1998, U.S. Pat. No. 5,808,783 by Sheridon titled "High Reflectance Gyricon Display" and issued Sep. 15, 1998, U.S. Pat. No. 5,815,306 by Sheridon et al., titled "'Eggcrate' Substrate For A Twisting Ball Display" and issued Sep. 29, 1998, U.S. Pat. No. 5,825,529 by Crowley titled "Gyricon Display With No Elastomer Substrate" and issued Oct. 20, 1998, and U.S. patent application Ser. No. 08/960,865 by Sheridon et al., titled "Twisting Cylinder Display" and filed Oct. 30, 1997, all incorporated by reference hereinabove.

In summary, gyricon media is comprised of a rotatable element, rotatably disposed in a substrate having two substantially parallel surfaces. One of the surfaces is a viewing surface. The rotatable element will have at least two different visually observable characteristics. For instance, the rotatable element might comprise a sphere wherein approximately one-half of the sphere's surface is colored white and the other half is colored black. However, many other variations of the rotatable elements have also been described such as elements having transparent and colored segments and elements that are cylindrically shaped.

Most often, the substrate comprises a thin sheet of elastomer into which the rotatable elements have been dispersed. The elastomer sheet is then swelled in a plasticizer which causes liquid filled cavities around the rotatable elements to form. In this form the rotatable elements are free to rotate within the substrate, but due to their inclusion within the liquid filled cavities, not free to undergo substantial translational movement within the elastomer substrate. However, other configurations have also been described such as close packed arrangements which contain rotatable elements and liquid between two solid sheets and rotatable elements which have been microencapsulated with a small volume of liquid and dispersed in a variety of solid substrate materials.

Any rotatable element can be selected and oriented by the application of an electric field across the portion of the gyricon media which contains that rotatable element. The orientation of the rotatable element will be determined by the direction of the applied electric field. In the simple case of black and white spheres an electric field may be applied substantially perpendicular to the viewing surface to cause the white surface of the sphere to be visible at the viewing surface. If the polarity of the electric field is reversed, the black surface of the sphere will be visible at the viewing surface. When the electric field is removed, the rotatable element retains its rotational alignment and continues to show whichever visual characteristic was selected by the electric field until the rotational alignment of the rotational element is changed by the application of another electric field. The selection of various areas of the gyricon media which are then driven to display a particular visual characteristic allows for the gyricon media to display images. Black and white, highlight color and full color display media are possible utilizing gyricon technology.

For the purposes of the following description, it will be assumed that the display media 10 is implemented using gyricon technology. However, it should be kept in mind that the display media 10 could well be implemented using Immedia electrophoretic technology as well or any other thin, lightweight, low-power, conformable display media. By conformable, it is meant that the display media is conformable to the substrate the display media is attached to or associated with. It is not meant to imply that the media must be mounted on or conformed to, for instance, a rigid substrate, but that the media will conform to the substrate whether it is rigid or flexible, planar or non-planar.

The display media 10 is driven by control circuitry 24. The function of the control circuitry 24 is to provide the voltage signals that generate the electric fields which cause image changes on the display media 10. For ease of explanation, the control circuitry has been broken up into three parts, the array of drivers 12, the control sequencer 14 and the power supply 16, however control circuitry 24 can be designed using many variations of circuitry, some of which are not easily broken up into these particular component parts.

The array of display drivers 12 communicates directly with the display media 10 through an array of lines 18. The drivers 12 receive their driving information from control sequencer 14 through an array of lines 20. The control sequencer 14 and the drivers 12 are both powered using a power supply 16 which provides power through lines 22 and 23.

The size and complexity of control circuitry needed will depend upon the size and complexity of the images to be produced on the display media 10. In the simplest case, only two such signals are needed to enable display media 10 to display a blinking pattern while a more complicated set of patterns will require a larger array of signals to be supplied. While many variations on the control circuitry 24 are possible, some examples of circuitry suitable for providing the voltage signals is described in copending U.S. patent application Ser. No. 09/153,327, by Richley et al., filed on Sep. 15, 1999, and titled "Ambient Energy Powered Display" incorporated by reference hereinabove.

In summary, U.S. patent application Ser. No. 09/153,327 describes two embodiments of circuitry applicable for use in driving circuitry 24 in FIGS. 5, 7, and 8–11. A power source, suitable for use in power supply 16, is described in FIGS. 5 and 7 of U.S. patent application Ser. No. 09/153,327 which comprises an ambient energy receiver. The ambient energy receiver could be an arrangement of solar cells to collect illumination, or some other circuitry to collect other forms of energy such as electromagnetic radiation, sound, electromagnetic fields, temperature, humidity, pressure, mechanical vibration or displacement or any other measurable form of energy that can be collected and converted into electrical energy to provide the necessary voltage signals. However, the power source need not be limited to the ambient energy receiver, equally well, the power source can be provided by a battery or an arrangement of batteries such as those used to power watches and calculators or even a connection to a power source such as an electrical wall socket.

The power source described above can be configured to supply any number of desired voltages. However, when gyricon media is used the drivers 12 require a different voltage supply than the control sequencer 14. While an additional power source could be used to supply the drivers 12 separately from the control sequencer 14 considerations of size and cost may make it preferable to use a single power source which is not intrinsically capable of providing the voltages needed to be supplied to both the drivers 12 and the control sequencer 14. For instance, when gyricon media is used, the drivers 12 may need to be supplied with a substantially higher voltage source than the control sequencer 14. Therefore, it may be advisable to configure the power supply 16 to supply both the lower voltage source needed for the control sequencer 14 and the higher voltage source needed for the drivers 12, as shown in FIG. 1. In that case, additional circuitry must be added to the power source to convert the lower voltages into the required higher voltages needed by the drivers 12. Two examples of such circuitry are described in FIGS. 5 and 7 in U.S. patent application Ser. No. 09/153,327. These circuits use an oscillator, some clocked devices and additional circuit elements to produce either high voltage pulses or a constant high voltage signal, either of which can be used to provide a high voltage signal to drivers 12. Regardless of its configuration, the function of the power supply 16 is to supply an appropriate voltage source to the control sequencer 14 and to the drivers 12.

The control sequencer 14 is used to provide additional logical driving information to the drivers 12 to determine how and when each of the individual drivers in the array of drivers 12 should be activated. The function of the control sequencer 14 is then is to provide correct logical values to each of the drivers 12 so that they can provide a desired image or series of images on the display media 10.

For instance, in a simple case, only two drivers may be needed and they may be driven to opposite states from each other. In such a case, the control sequencer 14 could be implemented with a simple inverting circuit which would receive power from the power supply 16 and output two opposite signals, for instance one high and one low, one for each of the two drivers in the driver array 12. However, in more complicated cases a larger array of drivers may be needed. In these cases the control sequencer 14 can be implemented in a variety of ways using for instance custom logic, PLAs, gate arrays, rom, ram, or a microprocessor, possibly, but not necessarily, in conjunction with some additional logic such as a shift register to insure that values for all the drivers 12 can be made available substantially simultaneously to drive an image change when a large number of drivers 12 is needed. This can happen when the particular circuitry used to calculate the individual voltages needed for the array of drivers 12 is not capable of providing all of the individual voltages substantially simultaneously and yet to effect an image change on the display media 10 they may be needed substantially simultaneously.

The drivers 12 can be implemented in a variety of ways and a specific implementation will be dictated by the particular driving needs of the specific display media 10, the number and complexity of the images desired to be produced on the display media and the space available to be allocated to the drivers among other criteria. Some implementations for drivers suitable for use with gyricon display media are contained in U.S. patent application Ser. No. 09/153,327 in FIGS. 8–11. FIGS. 8 and 9 show two implementations of drivers suitable for use with the power supply 16 and control sequencer 14 described above utilizing an active charge pump.

The control circuitry 24 can be provided in a variety of means that are known in the art. One embodiment provides the control circuitry 24 on a small, rigid circuit board. Another embodiment provides the control circuitry 24 on a small flexible circuit board or other flexible substrate such as a flex cable.

Figure 2:
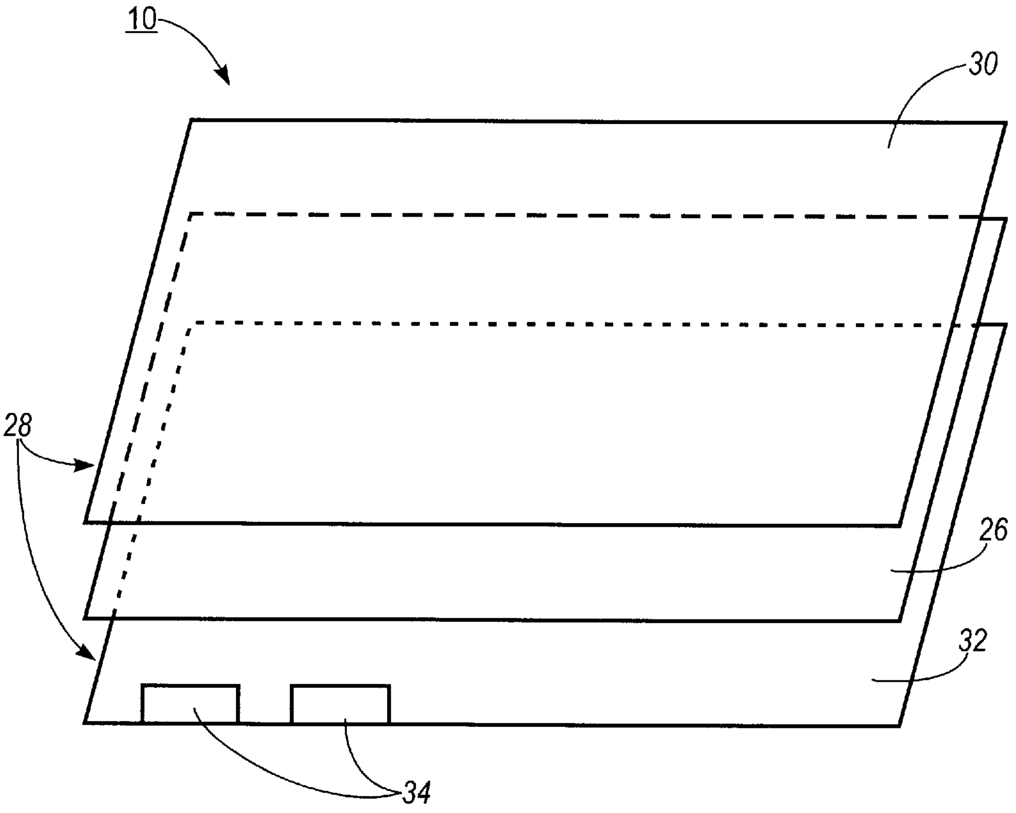
FIG. 2 is an exploded view of the display media shown in FIG. 1.

The display media 10 is further shown in FIG. 2 which is an exploded view of the display media 10. The display media 10 is comprised of a layer of sheet media 26, such as a sheet of gyricon media or Immedia electrophoretic display as described earlier, which has been interposed between an upper portion 30 and a lower portion 31 of a selection device 28. The selection device 28 is used to select and drive portions of the sheet media 26 to produce the desired images on the sheet media 26.

When gyricon sheet media 26 is used, it may be necessary to encapsulate the entire sheet of gyricon sheet media 26 to prevent it from drying out. It should be noted that in one embodiment of the device the gyricon sheet media 26 may be separately encapsulated from the selection device 28, as is known in the art, prior to interposing it between the upper portion 30 and the lower portion 32 of the selection device 28. However, in other embodiments, either one or both of the upper portion 30 and the lower portion 32 of the selection device 28 may also be used as encapsulating layers to encapsulate the sheet media 26. In yet another embodiment, a sheet media 26 may be of a type that doesn't need sheet encapsulation.

The selection device 28 is provided with conductive patterns on the upper portion 30 and the lower portion 32 which serve as addressing electrodes. As the upper portion 30 provides the viewing surface for the display media 10, the upper portion 30 should be substantially transparent. The upper portion can be provided by using, for example, a layer of glass, mylar, or other polyesters which have been coated with ITO patterns to provide the addressing electrodes. In some embodiments, the ITO pattern will be a coating covering the entire selection area space and will serve as a ground plane. As the lower portion 32 does not necessarily provide a viewing surface, it is not required that the lower portion 32 be transparent. The lower portion 32 could be provided by using the same materials for the upper portion 30, i.e. a layer of glass, mylar, or other polyesters which have been coated with ITO patterns to provide the addressing electrodes. However in other embodiments, the lower portion 32 could also be provided by using mylar or polyesters with conductive carbon or silver patterns to provide the addressing electrodes. In further embodiments, the lower portion 32 could be provided by using a conventional printed circuit board as is known in the art. In still further embodiments, the selection device may be integrated into the sheet media 26 by, for example, providing the addressing electrodes on the surfaces of the sheet media itself.

To maintain alignment between the selection device 28 and the sheet media 26, the selection device 28 and the sheet media 26 are attached to each other. For instance, the an adhesive may be applied to portions of the perimeter of the upper portion 30 and the lower portion 32 of the selection device 28 after the sheet media 26 has been interposed. If the one or more portions of the selection device 28 are also being used to encapsulate the sheet media 26, then it is necessary to use an adhesive which in effect seals the perimeter around the sheet media 26.

Also located on the lower portion 32 of the selection device 28 are connectors 34. The connectors may be located on the front side or the back side of the lower portion 32 using any standard connectors that are known in the art. The connectors 34 are required to provide for an electrical interconnection between the selection device 28 and the control logic 24. Connection may be made to the upper portion 30 either from the lower portion 32 via a tab connector such as, for example, SMT or ZIF type PCB connectors or by supplying the upper portion 30 with a separate set of connectors. Other alternatives include using conductive epoxies, soldered wire connections, clamps or conductive tape, The conductive patterns on the upper portion 30 and the lower portion 32 will depend on what type of addressing technique is being used. For instance, passive matrix and active matrix addressing techniques could be used as are known in the art. Alternatively, another embodiment for the addressing techniques is described in U.S. patent application Ser. No. 09/306,752 by Preas et al., titled "Method And Apparatus For A Display Producing A Fixed Set Of Images" and filed May 7, 1999, and incorporated by reference hereinabove. U.S. patent application Ser. No. 09/306,752 describes a method for producing a fixed set known of images. In summary, a two part selection device is used to address at least a portion of a display. One part of the selection device is used to provide a ground plane. The other part of the selection device contains electrode patterns which comprise the intersections of a series of overlapping images. By addressing the intersections of the images the number of drivers necessary becomes a function of the number of the images. In this manner, arbitrarily complex, overlapping images with a high degree of resolution can be addressed without the necessity of using a pixel level addressing mechanism with it's attendant complexity and cost issues. This addressing technique can also be combined with other addressing techniques such as passive or active matrix addressing for additional flexibility if desired.

Figure 3:
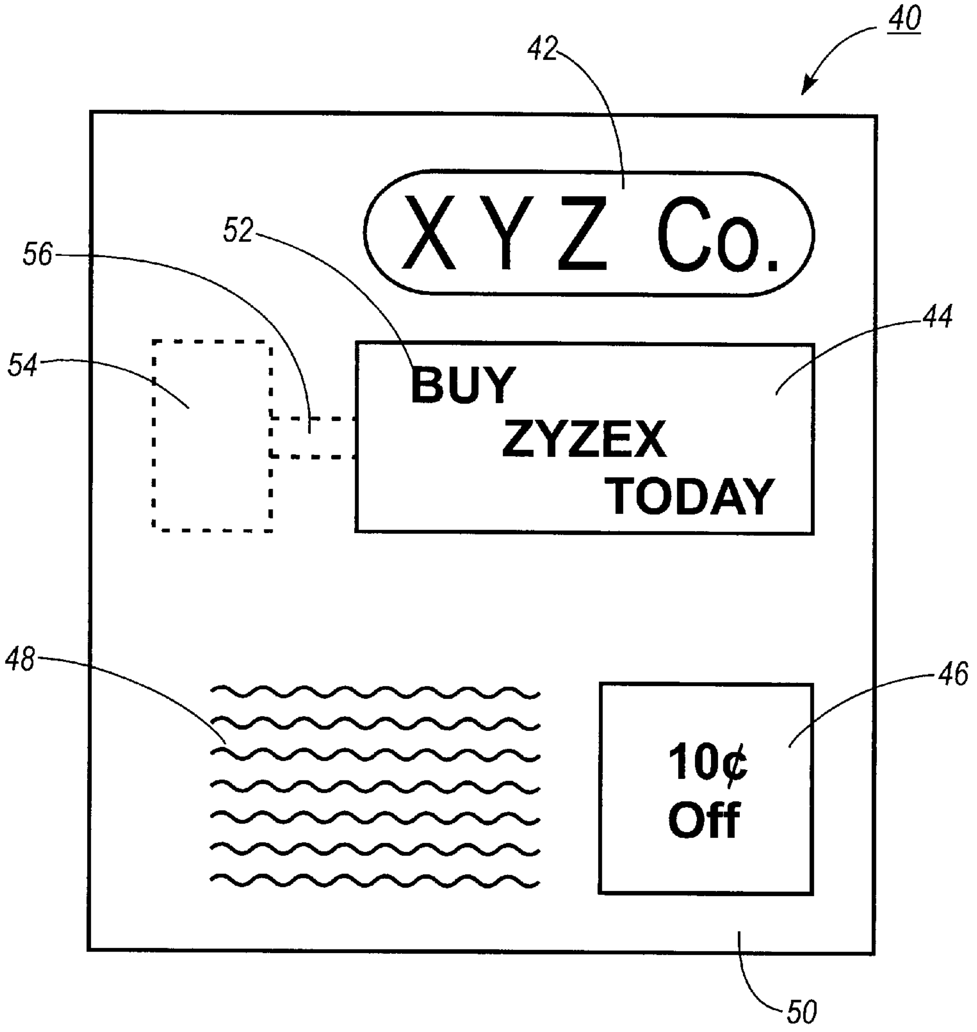
FIG. 3 is a depiction of a sign utilizing the system shown in FIG. 1.

FIG. 3 shows an example of how the system described above with reference to FIGS. 1 and 2 may be mounted on a substrate and used. FIG. 3 gives the example of a sign 40. The sign 40 could be an advertising sign, or an informational sign of another sort. For the purposes of this description, a point of sale advertising sign will be assumed. The sign 40 uses a substrate 50 as a carrier. The substrate 50 could be a variety of materials such as cardboard or other paper based substrates, plastics such as lucite, ceramics, metal, fabric, wood or any material that can be configured into a substrate of the desired size and shape. The sign 40 may be rigid and intended for either mounting or free standing use or it may be flexible and intended to be mounted on another structure such as a wall, bus stop, door, column, pole or a frame. Alternatively, the substrate may be a lightweight, flexible material, such as fabric and intended to be worn as an item of clothing or draped or used as a covering.

The substrate may be divided into various areas, for instance the upper portion of the substrate 50 might have an area with the company name either printed directly on the substrate 50 or printed on some other material that is adhered to the substrate 50. In the lower portion of the substrate 50 might be additional printed material 48. The printed material 48 could be an ingredients list, company philosophy, contest rules information or other desired information. The substrate could also carry a variety of other items such as removable coupons 46 which are also shown in the bottom portion of the substrate 50. It should be noted that the arrangement and placement of various items shown in FIG. 3 are for illustrative purposes only and that any of the items may be placed in any arbitrary location on the substrate 50. Also, it should be noted that the items listed are exemplary and could include any variety of items, including but not limited to diagrams, brochures, booklets, or promotional giveaways.

The central portion of the substrate 50 is shown carrying the display media 44 on one side of the substrate 50 and the control circuitry 54 on the reverse side of the substrate 50. However, this need not be so. While it may be desired to obscure the control circuitry 54 from view by placing it behind the substrate 50, the control circuitry may also be obscured from view by either attaching it to the substrate 50 or embedding it within the substrate 50 behind the display media 44 or other items attached on the substrate 50. Alternatively, it may be desired not to obscure the control circuitry 54 from view in order to impart a "high tech" look to the sign 40 as it has been sometimes fashionable to do. An electrical connector 56 connects the control circuitry 54 with the display media 44 and may be either obscured from view or shown as is desired.

The display media 44 can be attached to substrate 50 in a variety of ways. For instance, the display media could be removeably attached to the substrate 50 by using removable adhesive, velcro, hooks, snaps, screws, buttons, zippers, bolts, clamps, clips or any other means of removeably attaching the display media 44 to the substrate 50. Additionally, the substrate 50 could be configured with a substantially transparent pocket made of either rigid or flexible materials such as plastic which could contain the display media 44. The display media 44 could also be attached using glues, adhesives, rivets or any other means which are not intended to allow for easy removeability, such as epoxies or the like as are known in the art.

Furthermore, overlays or special viewing windows may be placed on or over the display media 44. For instance, if the display media is to display changing data in a tabular format, an overlay which shows the "grid" lines of the table may be used. In another example, it may be desired to place a corporate logo on one portion, such as a corner, of the display media 44. Such overlays may be either transparent or opaque. They can either be implemented as part of the transparent upper portion of the display media 10 shown in FIG. 2 or attached to the substrate 50 of the sign 40 shown in FIG. 3. For instance, if a transparent pocket is used to attach the display media 44 to the substrate 50, the transparent pocket may have information or graphics printed on it. Alternatively, the overlays may be removeably attached to the substrate 50 or the display media 44, such as, for example, by means of velcro, repositional adhesives or other means, to allow for easy interchangeability. In an another embodiment, overlays may be implemented using stickers which can be applied either directly to the display media 44 or to a window which overlays the display media 44.

The control circuitry 54 can also be attached to the substrate 50 in a variety of ways. For instance, the control circuitry 54 could be removeably attached to the substrate 50 by using removable adhesive, velcro, hooks, snaps, rivets, bolts, screws, buttons, zippers, clamps, clips or any other means of removeably attaching the control circuitry 54 to the substrate 50. Additionally, the substrate 50 could be configured with a pocket made of either rigid or flexible materials such as plastic which could contain the control circuitry 54. The control circuitry 54 could also be attached using glues, adhesives, rivets or any other means which are not intended to allow for easy removeability, such as epoxies or the like as are known in the art.

In short, both the display media 44 and the control circuitry 54 are secured to the substrate 50 where each may be secured either removeably or non-removeably, and independently of the other. Removeably attaching either the display media 44 or the control circuitry 54 allows for easy interchangeability and replacement of the items.

Figure 4:
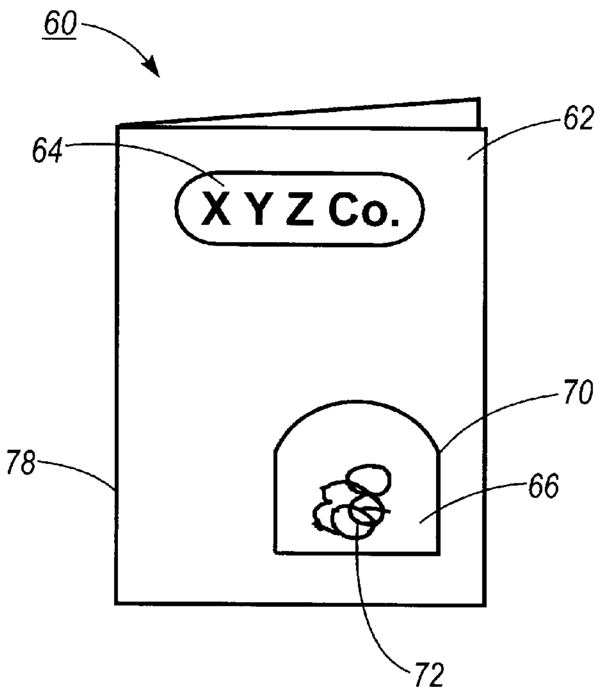
FIG. 4 is a depiction of a foldable object in the folded state utilizing the system shown in FIG. 1.
Figure 5:
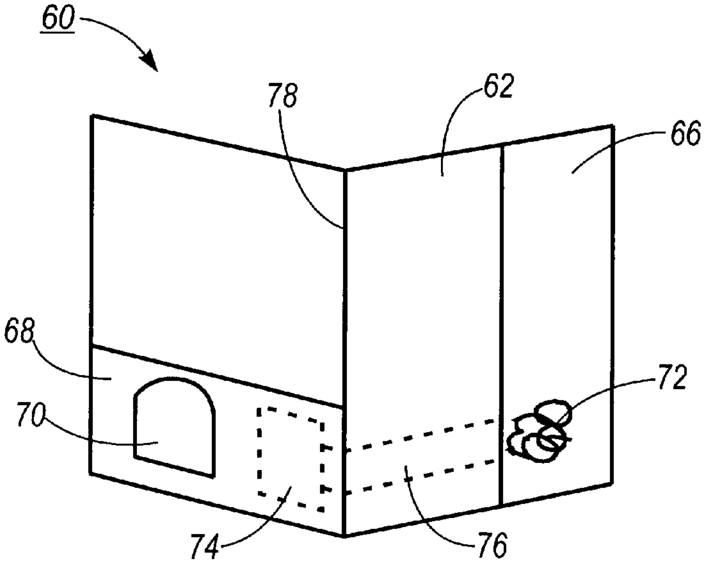
FIG. 5 is a depiction of the foldable object shown in FIG. 4, in an unfolded or partially folded state.

FIGS. 4 and 5 show another example of how the system described above with reference to FIGS. 1 and 2 may be mounted on a substrate and used. FIGS. 4 and 5 gives the example of a folder 60. The folder 60 could be a brochure, notebook, binder, greeting card or other folded or hinged item. For the purposes of this description a brochure will be assumed. The folder 60 uses a substrate 62 as a carrier. The substrate 62 could be a variety of materials such as cardboard or other paper based substrates, plastics such as lucite, ceramics, metal, fabric, wood or any material that can be configured into a substrate of the desired size and shape. The folder 60 has a fold line 78. The folder 60 may be constructed out of a unitary piece which is folded along the fold line 78 or it may be constructed out of two or more pieces which are flexibly or foldably joined along the fold line 78, such as by a hinge. The folder 60 may be constructed from either rigid materials or from flexible materials.

As with the sign 40 example discussed with respect to FIG. 3, the substrate may be divided into various areas, for instance at the upper portion of the substrate 62 might be an area with the logo or company name 64 either printed directly on the substrate 62 or printed on some other material that is attached to the substrate 62. It should be noted that the arrangement and placement of various items shown in FIGS. 4 and 5 are for illustrative purposes only and that any of the items may be placed in any arbitrary located on the substrate 62. Furthermore, the items listed are exemplary and could include any variety of items.

The lower portion of the substrate 62 is shown with a cut-out or window 70 through which a portion of the display media 66 is viewable when the folder 60 is folded as shown in FIG. 4. The control circuitry 74 has been attached to the substrate 62 so that it is not viewable. Looking at FIG. 5, which shows the folder 60 in an unfolded or only partially folded condition, it can be seen that the inside of folder 60 has a pockets 68 which can be used to carry the control circuitry 74. However, this need not be so. While it may be desired to obscure the control circuitry 74 from view by placing it behind the pocket 70, the control circuitry 74 may also be obscured from view by attaching it within a multilayer substrate. Alternatively, it may be desired not to obscure the control circuitry 74 from view in order to impart a "high tech" look to the folder 70 as it has been sometimes fashionable to do. A flexible electrical connector 76 connects the control circuitry 74 with the display media 66 and may be either obscured from view or shown as is desired. The display media 66 is disposed on an inside portion of the substrate 62 so that it is completely viewable when the folder is opened, as shown in FIG. 5

The display media 66 can be attached to substrate 62 in a variety of ways. For instance, the display media could be removeably attached to the substrate 50 by using removable adhesive, velcro, hooks, snaps, bolts, screws, buttons, zippers, clamps, clips or any other means of removeably attaching the display media 44 to the substrate 50. Additionally, the substrate 62 could be configured with a substantially transparent pocket made of either rigid or flexible materials such as plastic which could contain the display media 66. The display media 44 could also be attached using glues, adhesives, rivets or any other means which are not intended to allow for easy removeability, such as epoxies or the like as are known in the art. The display media 66 could also be interposed between different layers of a multilayer substrate 62 with a window or opening through which it is viewable.

The control circuitry 74 can also be attached to the substrate 62 in a variety of ways. For instance, the control circuitry 74 could be removeably attached to the substrate 62 by using removable adhesive, velcro, hooks, snaps, bolts, screws, buttons, zippers, clamps, clips or any other means of removeably attaching the control circuitry 74 to the substrate 62. Additionally, the substrate 62 could be configured with a pocket made of either rigid or flexible materials such as plastic which could contain the control circuitry 54. The control circuitry 54 could also be attached using glues, adhesives, rivets or any other means which are not intended to allow for easy removeability, such as epoxies or the like as are known in the art. The control circuitry 74 could also be interposed between different layers of a multilayer substrate 62, possibly also with a window or opening through which it is viewable.

In short, both the display media 66 and the control circuitry 74 are secured to the substrate 50 where each may be secured either removeably or non-removeably, and independently of the other. Removeably attaching either the display media 66 or the control circuitry 74 allows for interchangeability and easy replacement of the items.

Figure 6:
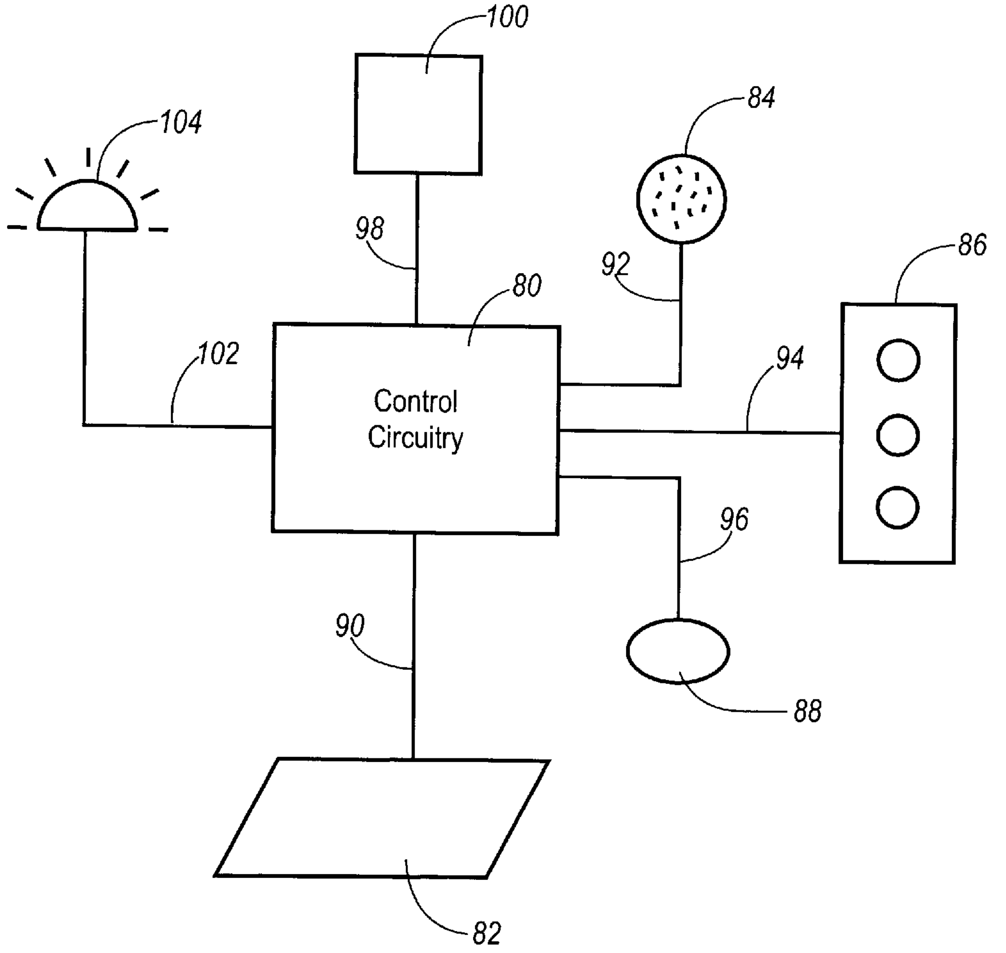
FIG. 6 is a system diagram.

FIG. 6 shows a system diagram similar to FIG. 3 where additional features have been added to the system of FIG. 3. The system shown in FIG. 6 comprises a display media 82 electrically connected to control circuitry 80 through line 90. This portion of the system is identical to that described with respect to FIG. 3 above. Additional features shown in FIG. 6 include a sensor element 88 connected to control circuitry 80 through line 88, button or button elements 86 connected to control circuitry 80 through line 94, a speaker element 84 connected to control circuitry 80 through line 92, a network interface element connected to the control circuitry 80 through line 98, and a light element 104 connected to the control circuitry 80 through line 102.

The sensor element 88 can be implemented using any commercially available sensor which can be used to detect various characteristics of the environment. The sensor element can be used to detect light, motion, temperature, sound, or pressure and send that information to the control circuitry 80. The control circuitry 80 could then use the information provided by the sensor either initiate some action with respect to the system or the display media 82. For instance, a light, pressure or motion sensor element 88 could be used to detect when a folder, such as the one described with reference to FIGS. 4 and 5 above, has been opened. A temperature sensor element 88 could be used to detect the ambient temperature, which could then be displayed on the display media 82. A sound sensor 88 could be used to detect the noise levels. A sign utilizing such a system in a library could then change the display medium 82 to read "SHHHHH!" when noise is detected. Many such uses can be envisioned and these are just a few examples.

The button elements 86 can be implemented by using any conventional buttons which are known in the art. These include buttons mounted on a separate control panel or buttons implemented on a sheet, which may or may not be placed beneath or on top of the display media 82. The button elements could be used to implement an interactive version of the system. For instance, activation of a specific button may be used to determine which of several images the display media 82 will show. Additionally, the button elements 86 may be used to activate other system functions, either in conjunction with or separate from the display media 82, such as those of the speaker element 84 or the network interface 100.

The speaker element 84 can be implemented using any commercially available micro-power audio chip. The speaker element can be activated when for instance a folder is opened, a button element 86 is pressed, or a sensor element detects the presence of someone. One example of an item incorporating a speaker element is a card which plays a tune when it opens. The control circuitry 80 can be used to synchronize an image sequence to be displayed with audio output from the speaker element 84.

The network interface 100 is used to transmit data to and from an external system and can be implemented using conventional hardwired plug, IR or RF networking technology. The network interface 100 would allow for addressing, reprogramming, downloading, or uploading of information in the control circuitry 80. One example of such a use would be a sign utilizing such a system which includes a temperature sensor. The control circuitry 80 would receive the temperature information from the sensor element 88 and store the temperature information in memory while also using the temperature information to display the current temperature on the display media 82. At periodic intervals, the network interface 100 could be used to download the stored temperature information to another system. Other examples include, for instance to use the network interface 100 to update pricing or discount offers on a point of sale display. Further examples include, for instance reprogramming the control circuitry to display a new sequence of images on the display media 82. Essentially then, the network interface 100 provides a way to communicate directly with the control circuitry 100.

The light element 104 can be implemented in a variety of ways. For instance, several small low power LEDs might be utilized as highlight elements on a point of sale sign. They could be driven by the control circuitry 80 to turn on according to a predetermined sequence, to blink, or to be activated simultaneously with some other element such as the display media 82 or the speaker element 84.

Another alternative for the light element 104 would be to provide lighting for the system as a whole. For instance, incandescant or fluorescent lighting might be supplied to light portions of the system such as the display media 82. The light element 104 might work in conjunction with a sensor element 84 to detect low levels of light and then turn on the light element 104. Once example of such an application might be in a restaurant or theater where the available lighting for viewing the display media 82 may change from bright to dim during the course of an evening. As the available light is reduced, the light element 104 could provide additional light directed at the display media 82.

The system shown in FIG. 6 can be implemented in a variety of substrates and systems such as those shown in FIGS. 3-5 with respect to the system shown in FIG. 1. It should be pointed out however, that the additional system elements shown in FIG. 6, that is the network interface 100, the speaker element 84, the button element 86 the sensor element 88, and the light element 104 are shown all being used in the same system for the ease of discussion. Any one or more individual elements can be added to the system shown in FIG. 1 to implement a variety of systems that may be suited to the various needs of any given user or situation.

It should also be noted that while the examples shown in FIGS. 3–5 are essentially planar items, that this need not be the case. A wide variety of materials are possible to use as a substrate leading to a wide variety of configurations and uses. For instance, a fabric substrate may be used to make an advertising banner or an item of clothing. A ceramic substrate can be used to make a variety of items including a wall plaque or a coffee mug. A wood or metal substrate can be used to make rigid signs or furniture such as a tabletop or bus stop bench. Essentially, any object can be made which can be enhanced by the addition of a display media and its associated control logic.

What is claimed is:

1. A system for displaying information comprising:

a) a substrate having a substrate display surface with information thereon, b) a conformable display media removeably affixed to said substrate, said conformable display media having an input for receiving display information and a display media display surface, said display media being so constructed and arranged with said substrate such that at least a portion of the substrate display surface and at least a portion of the display media display surface are visible to a viewer situated to view the system, and c) control logic so constructed and arranged to provide display information to said display media through the display media input wherein said control logic is associated with said substrate.

2. The system of claim 1 wherein the control logic further comprises a power source.

3. The system of claim 2 wherein the power source comprises an ambient energy receiver.

4. The system of claim 2 wherein the ambient energy receiver comprises at least one solar cell.

5. The system of claim 2 wherein the power source comprises at least one battery.

6. The system of claim 1 further comprising means to connect to a power source.

7. The system of claim 1 wherein the conformable display media comprises gyricon display media.

8. The system of claim 1 wherein the conformable display media comprises electrophoretic display media.

9. The system of claim 1 wherein the display media is removeably affixed to the substrate by using at least one of: adhesive, velcro, hook, snap, button, zipper, screw, bolt, clamp, clip or an at least partially transparent pocket.

10. The system of claim 1 wherein the control circuitry is removeably affixed to the substrate.

11. The system of claim 10 wherein the control circuitry is removeably affixed to the substrate by using at least one of: adhesive, velcro, hook, snap, screw, button, zipper, bolt, clamp, clip or a pocket.

12. The system of claim 1 wherein the control circuitry is permanently affixed to the substrate.

13. The system of claim 12 wherein the control circuitry is permanently affixed to the substrate using at least one of: adhesive, or rivet.

14. The system of claim 1 wherein the control circuitry is at least partially embedded in the substrate.

15. The system of claim 1 wherein the substrate comprises two or more layers and the control circuitry is at least partially interposed between two of the layers.

16. The system of claim 1 further comprising a speaker element so constructed and arranged to receive speaker information from the control circuitry and to respond to said speaker information.

17. The system of claim 1 further comprising a sensing element so constructed and arrange to provide sensing information to the control circuitry and said control circuitry is so constructed and arranged to receive said sensing information.

18. The system of claim 17 wherein the sensing element can sense at least one of light, motion, temperature, sound or pressure.

19. The system of claim 1 further comprising a selection element so constructed and arranged to provide selection information to said control circuitry wherein said control circuitry is so constructed and arranged to receive and respond to said selection information.

20. The system of claim 19 wherein the selection element comprises at least one selection button.

21. The system of claim 1 further comprising a light element so constructed and arranged to receive light information from the control circuitry and respond to said light information.

22. The system of claim 21 wherein the light element comprises at least one of an LED, incandescent light or fluorescent light.

23. The system of claim 1 further comprising a communication element for communicating with said control circuitry.

24. The system of claim 23 wherein the communication element is a network interface element.

25. The system of claim 23 wherein the communication element is chosen from at least one of a plug, IR or RF connector.

26. The system of claim 1 wherein the substrate is rigid.

27. The system of claim 1 wherein the substrate is flexible.

28. The system of claim 1 wherein the substrate is planar.

29. The system of claim 1 wherein the substrate is non-planar.

30. A system for displaying information comprising:

a) a substrate having a substrate display surface with information thereon, b) a conformable display media associated with said substrate, said conformable display media having an Input for receiving display information and a display media display surface, said display media being so constructed and arranged with said substrate such that at least a portion of the substrate display surface and at least a portion of the display media display surface are visible to a viewer situated to view the system, and c) control logic so constructed and arranged to provide display information to said display media through the display media input wherein said control logic is removeably affixed to said substrate.

31. The system of claim 30 wherein the control logic further comprises a power source.

32. The system of claim 31 wherein the power source comprises an ambient energy receiver.

33. The system of claim 32 wherein the ambient energy receiver comprises at least one solar cell.

34. The system of claim 31 wherein the power source comprises at least one battery.

35. The system of claim 30 further comprising means to connect to a power source.

36. The system of claim 30 wherein the conformable display media comprises gyricon display media.

37. The system of claim 30 wherein the conformable display media comprises electrophoretic display media.

38. The system of claim 30 wherein the display media is removeably affixed to the substrate.

39. The system of claim 38 wherein the display media is removeably affixed to the substrate by using at least one of: adhesive, velcro, hook, snap, button, zipper, screw, bolt, clamp, clip or an at least partially transparent pocket.

40. The system of claim 30 wherein the display media is permanently affixed to the substrate.

41. The system of claim 40 wherein the display media is permanently affixed to the substrate using at least one of: adhesive or rivet.

42. The system of claim 30 wherein the display media is at least partially embedded in the substrate.

43. The system of claim 30 wherein the substrate comprises two or more layers and the display media is at least partially interposed between two of the layers.

44. The system of claim 30 wherein the control circuitry is removeably affixed to the substrate by using at least one of: adhesive, velcro, hook, snap, screw, button, zipper, bolt, clamp, clip or a pocket.

45. The system of claim 30 further comprising a speaker element so constructed and arranged to receive speaker information from the control circuitry and to respond to said speaker information.

46. The system of claim 30 further comprising a sensing element so constructed and arrange to provide sensing information to the control circuitry and said control circuitry is so constructed and arranged to receive said sensing information.

47. The system of claim 46 wherein the sensing element can sense at least one of light, motion, temperature, sound or pressure.

48. The system of claim 30 further comprising a selection element so constructed and arranged to provide selection information to said control circuitry wherein said control circuitry is so constructed and arranged to receive and respond to said selection information.

49. The system of claim 48 wherein the selection element comprises at least one selection button.

50. The system of claim 30 further comprising a light element so constructed and arranged to receive light information from the control circuitry and respond to said light information.

51. The system of claim 50 wherein the light element comprises at least one of an LED, incandescent light or fluorescent light.

52. The system of claim 30 further comprising a communication element for communicating with said control circuitry.

53. The system of claim 52 wherein the communication element is a network interface element.

54. The system of claim 52 wherein the communication element is chosen from at least one of a plug, IR or RF connector.

55. The system of claim 30 wherein the substrate is rigid.

56. The system of claim 30 wherein the substrate is flexible.

57. The system of claim 30 wherein the substrate is planar.

58. The system of claim 30 wherein the substrate is non-planar.

* * * * *